United States Patent [19]
Kane

[11] 4,336,528
[45] Jun. 22, 1982

[54] SEMICONDUCTOR RESISTIVE NETWORK

[75] Inventor: Jeffrey Kane, Cheadle Hulme, England

[73] Assignee: Ferranti Limited, Hollinwood, England

[21] Appl. No.: 855,258

[22] Filed: Nov. 28, 1977

Related U.S. Application Data

[63] Continuation-in-part of Ser. No. 710,746, Aug. 2, 1976, abandoned.

[30] Foreign Application Priority Data

Nov. 27, 1976 [GB] United Kingdom ............. 49575/76

[51] Int. Cl.$^3$ ..................... H01L 27/04; G08C 9/00
[52] U.S. Cl. .................... 340/347 DA; 340/347 M; 357/48; 357/45; 357/51
[58] Field of Search ...................... 357/36, 51, 48; 340/347 DA

[56] References Cited

U.S. PATENT DOCUMENTS

| | | | |
|---|---|---|---|
| 3,644,802 | 2/1972 | Dingwall | 357/51 |
| 3,995,304 | 11/1976 | Pease | 357/36 |
| 4,053,336 | 10/1977 | Grundy et al. | 357/51 |

OTHER PUBLICATIONS

Dooley, "Complete Monolithic ... D/A ... ", IEEE J. of Solid-State Circuits, vol. SC 8, No. 6, Dec. 1973, pp. 404–405.

Kelson et al., IEEE J. of Solid-State Circuits, vol. SC 8, No. 6, Dec. 1973, p. 396.

Hamilton & Howard, Basic Integrated Circuit Engineering, McGraw-Hill, N.Y., 1975, pp. 420-421.

Primary Examiner—William D. Larkins
Attorney, Agent, or Firm—Kerkam, Stowell, Kondracki & Clarke

[57] ABSTRACT

A network of different weighted resistances, for example, binary resistances, coupled in parallel with each other, is provided in a semiconductor body by providing a plurality of substantially identical resistors, with different numbers of the identical resistors being coupled in parallel to provide the required different weighted resistances of the network, possibly, the constituent identical resistors of the different weighted resistances of the network being interdigitated with each other. The resistors, when comprising parts of current sources, each may be connected, individually, in series with a bipolar transistor, different identical bipolar transistors being connected in series with different resistors, so that there is associated with each of the different weighted resistances of the network, different total emitter areas, each product of a total emitter area and associated resistance being a constant, so that inversely corresponding, different weighted currents are obtained through the different weighted resistances, and a constant potential difference is applied across each constituent resistance of the network.

14 Claims, 10 Drawing Figures

SEMICONDUCTOR RESISTIVE NETWORK

This is a continuation in part of Ser. No. 710,746, filed Aug. 2, 1976, now abandoned, of which Ser. No. 876,137, filed Feb. 8, 1978, now U.S. Pat. No. 4,161,742, is a continuation.

This invention relates to semiconductor devices, and in particular to devices each including a network of different resistances coupled in parallel with each other, the different resistances being weighted in accordance with a predetermined radix, for example, the network comprising binary weighted resistances.

For convenience, in this specification the term "weighted" will be employed to refer to different values of a parameter associated with circuit elements of a network, such as the resistance of a resistor, the different values being weighted in relation to each other in accordance with a predetermined radix.

Desirably the different weighted resistances of a network of resistances are required to be provided as accurately as possible, especially if the network is to be included in a device such as an analogue-to-digital (A/D) converter.

It is known to provide a network of different weighted resistances coupled in parallel with each other in the form of thin film resistors on a suitable substrate, the desired different resistance values being obtained accurately by trimming the thin film resistors in a suitable way under normally-encountered operating conditions for the network.

It is also known to provide a network of different weighted resistors coupled in parallel with each other in a monolithic semiconductor body of a semiconductor device. However, because of inadvertent and unmeasurable variations of parameters and operating conditions throughout the semiconductor body, and because of inadequate control in the processing steps employed in fabricating such a device, it was previously impossible to provide sufficiently accurately for some applications the required different weighted resistances of the network under normally encountered operating conditions for the device. Further, it is usually impossible to trim satisfactorily such semiconductor resistors. The inadvertent and unpredictable variations of the resistances at least partially are caused by inadvertent and unpredictable variations of the voltage-resistance operating characteristic, and other operating characteristics, of the network resistors. Predictable variations in the operating characteristics of the resistors, and in the parameters and the operating conditions throughout the semiconductor body, conveniently, may be at least partially compensated for when designing the semiconductor device.

It is known to provide a network of different weighted resistors coupled in parallel with each other in a semiconductor device, the circuit arrangement of the device, and the construction of the device, being such that in the operation of the device substantially the same potential difference is applied across each constituent resistor of the network. This reduces the effect of inadvertent and unpredictable variations of the voltage-resistance operating characteristic of the network resistors to less than would otherwise be the case. In order that the same potential difference is applied across the constituent resistors, each resistor of the network is connected individually to, and in series with, a bipolar transistor, and is part of a current source, the bipolar transistors having different weighted total emitter areas at the emitter contact bearing surface of the semiconductor body of the device. The arrangement is such that each product of a total emitter area and the resistance of the resistor connected to the transistor having this total emitter area is a constant, for each such series combination of a transistor and a resistor of the network. Hence, in such an arrangement, binary weighted resistors R, 2R and 4R are connected in series with bipolar transistors having, respectively, binary weighted total emitter areas of 4 units, 2 units and 1 unit, and there is produced binary weighted currents through the resistors of, respectively, 4 units, 2 units and 1 unit.

It is an object of the present invention to provide a semiconductor device in a monolithic semiconductor body, the device having a network of different weighted resistances coupled in parallel with each other of a novel and advantageous construction. In particular, for any construction in the semiconductor device for the constituent resistors of the network, the novel network construction is such that the constituent resistors may have more highly matched operating characteristics than would be the case for corresponding known such network constructions; the effects of inadvertent and unpredictable variations in the operating characteristics of the constituent resistors may be reduced from what would be the case for corresponding known such network constructions; and inadvertent and unpredictable variations in the operating conditions to which the constituent resistors are subjected may be reduced from what would be the case for corresponding known such network constructions. In any event, for any resistor construction, the desired different weighted resistances of the network are obtained more accurately, under normally-encountered operating conditions for the device, than for a corresponding such network, because the constituent resistors of the network have more highly matched operating characteristics, and/or because the effects of inadvertent and unpredictable variations in the operating characteristics of the constituent resistors of the network are reduced, and/or because inadvertent and unpredictable variations in the operating conditions to which the constituent resistors of the network are subjected are reduced.

According to the present invention a semiconductor device in a monolithic semiconductor body has a network of different weighted resistances, the different resistances being coupled in parallel with each other, the different resistances comprising a plurality of substantially identical resistors, with different numbers of the identical resistors being coupled in parallel to provide the required different weighted resistances of the network.

One of the resistances of the network may comprise only one of the constituent identical resistors.

The different weighted resistances of the network and/or the identical constituent resistors of these resistances may be either directly, or indirectly, connected in parallel.

By providing a plurality of substantially identical resistors, with any construction, it is possible that the constituent resistors of the network have more highly matched operating characteristics than if different weighted resistors of the same construction had been provided in the semiconductor body.

Further, in order to reduce the effect of inadequately controlled processing steps, and/or of variations of relevant parameters and/or operating conditions within the semiconductor body, and to obtain highly matched operating characteristics for the substantially identical resistors, by reducing inadvertent and unpredictable variations of such operating characteristics, the identical resistors of the network may have substantially the same orientation in relation to each other within the semiconductor body. For example, if the resistors of the network extend linearly within the semiconductor body, which is an advantageous shape in this respect, the resistors extend parallel to each other. Further, it is advantageous if the substantially identical resistors are as close to each other as possible within the semiconductor body. A particularly advantageous form of the device is one in which the constituent substantially identical resistors of each of the different weighted resistances of the network, where appropriate, are spaced from each other by other substantially identical resistors of said plurality of identical resistors of the network, and are uniformly distributed throughout the provided plurality of resistors of the network. Hence, if the substantially identical resistors are linear in form, and extend parallel to each other, they are interdigitated with each other. Satisfactory interdigitation of the constituent network resistors in order to obtain highly matched operating characteristics is difficult when different weighted resistors are provided for the network.

Even if the constituent substantially identical resistors of the network have highly matched operating characteristics there may be inadvertent and unpredictable variations of relevant operating conditions, such as temperature gradients within the body, which are capable of causing inadvertent and unpredictable variations in the different weighted resistances of the network. However, with any one of the constructions for a network of identical resistors referred to in the preceding paragraph the effects of such inadvertent and unpredictable operating conditions are less than otherwise would be the case.

In addition to providing substantially identical resistors with more highly matched operating characteristics than would be the case with different weighted network resistors, the effect of inadvertent and unpredictable variations of the operating characteristics of the constituent substantially identical resistors may be reduced by the operating conditions to which the substantially identical resistors are subjected being more uniform in relation to each of the identical resistors, compared with if different weighted resistors for the network had been provided, because the substantially identical resistors, to provide at least all but one of the different weighted resistances, are coupled in parallel to form each such resistance of the network. Hence, in operation of the device, at least, the same potential difference is applied across each substantially identical resistor, and the effect of inadvertent and unpredictable variations in the voltage-resistance operating characteristic of the resistors is reduced.

Thus, each of the substantially identical resistors may have any convenient construction within the semiconductor body, and may have a construction which inherently is incapable of providing such a network of different weighted resistors with highly matched operating characteristics for the resistors, but which provides such a network construction in accordance with the present invention, having in the operation of the device, sufficiently accurately provided different weighted resistances for many different desired applications. Superficially the arrangement according to the present invention should be disadvantageous to be embodied in a monolithic semiconductor device, because the total resistance value of the network is greater than, for example, if a corresponding 2R-R ladder network has been employed; and because of the greater number of constituent substantially identical resistors for the network than if, for example, different weighted resistors had been employed; the arrangement inherently occupying a greater area of the contact-bearing surface of the semiconductor body, reducing manufacturing yields.

However, in order for a device according to the present invention to be advantageous, it is required that, for any resistor construction, the desired different weighted resistances of the network are obtained more accurately, under normally-encountered operating conditions for the device, than for a corresponding different weighted resistor network. This criterion is readily obtainable because the constituent substantially identical resistors of the network have more highly matched operating characteristics, and/or because the effects of inadvertent and unpredictable variations in the operating characteristics of the constituent substantially identical resistors of the network are reduced, and/or because inadvertent and unpredictable variations in the operating conditions to which the constituent substantially identical resistors of the network are subjected are reduced. This is, in general, because a network of a plurality of substantially identical resistors is provided.

Because, generally, current switches have a better performance than voltage switches, if switches are to be connected to the different weighted resistances of a network according to the present invention, it is convenient to provide for the network, and in the operation of the device, different weighted currents, the different weighted currents selectively to be switched ON and OFF by associated current switches. Hence, each resistance of the network of different weighted resistances may be connected individually to, and in series with, a bipolar transistor of the device, and the resistance is part of a current source. As indicated above, it is known to have a device having different weighted resistors connected individually to, and in series with, bipolar transistors, and as part of current sources, the bipolar transistors having different weighted total emitter areas, the arrangement being such that each product of a total emitter area, and the resistance of the resistor connected to the transistor having this total emitter area, is a constant, for each such series combination of a transistor and a resistor of the network. In a corresponding network according to the present invention each resistance of the network of different weighted resistances is connected individually to, and in series with, a bipolar transistor of the device, different resistances of the network being connected to different bipolar transistors, and each resistance being connected to a bipolar transistor, the different bipolar transistors of the plurality of provided bipolar transistors having different weighted total emitter areas, the arrangement being such that each product of a total emitter area, and the resistance connected to the bipolar transistor having this total emitter area, is a constant for each such series combination of a bipolar transistor and a resistance of the network. Thus, there is provided the required different weighted currents of the network. Further, a plurality of identical bipolar transistors may be connected individually to, and in series with, the plurality of substantially identical resistors, different identical bipolar transistors being connected to different substantially identical resistors, and each resistor is connected to a bipolar transistor, the identical series combinations, each of a resistor and a bipolar transistor, being coupled together to provide the network, where more than one identical bipolar transistor is associated with a constituent resistance of the network, the associated bipolar transistors being considered to be a single bipolar transistor with the required total emitter area. Hence, because identical resistors and bipolar transistors are provided in such a network the resistors and bipolar transistors, may have more highly matched operating characteristics, for example, in relation to the emitter-base operating potential difference of the transistors, and/or the effect of inadvertent and unpredictable variations of these operating characteristics may be reduced, because the identical resistors and bipolar transistors are subjected to more uniform operating conditions than for the previously known arrangement.

The current switches may have any convenient form, for example, each comprising a long-tailed pair of bipolar transistors. Identical current switches may be provided individually in series with each series combination of an identical resistor and an identical bipolar transistor, instead of only one such current switch being provided for each weighted resistance of the network of the device. Thus, the identical resistors, bipolar transistors and current switches, may have more highly matched operating characteristics, and/or the effect of inadvertent and unpredictable variations of these operating characteristics may be reduced, because the identical resistors, bipolar transistors and current switches are subjected to more uniform operating conditions than otherwise would be the case.

Whether the plurality of identical resistors of a device according to the present invention are to be connected in series with bipolar transistors, as part of current sources, or not, the monolithic semiconductor device may include bipolar transistors. Hence, the resistor construction employed, advantageously, closely resembles the bipolar transistor construction employed within the device. For this reason it may be desirable to use within the network a resistor construction in relation to which it is inherently difficult to obtain a network of different weighted resistors with highly matched operating characteristics.

Certain advantageous bipolar transistor constructions are each formed in a semiconductor body having a thin layer of one conductivity type, usually an epitaxial layer, on a substrate of the same conductivity type. The collector of the opposite conductivity type including a buried layer at a portion of the interface between the thin layer and the substrate and an isolation barrier for the transistor, the isolation barrier extending through the thin layer to contact the buried layer. The base comprises a region of the thin layer. The emitter of the opposite conductivity type is provided within the base and adjacent to the surface of the thin layer remote from the substrate. Contacts are provided on the surface of the thin layer remote from the substrate. Other types of component, e.g., such as a resistor having resistive material comprising a region of the thin layer of said one conductivity type, and defined by the combination of a buried layer of the opposite conductivity type at a portion of the interface between the thin layer and the substrate, and an isolation barrier for the resistor extending through the thin layer to contact the buried layer, have a construction closely resembling that of the bipolar transistor.

All the different types of components of such a device may be provided by the same processing steps as are required to form the bipolar transistors. In a monolithic semiconductor body of a device a plurality of different components may be provided simultaneously with the bipolar transistors. These processing steps are advantageous in forming a semiconductor device, particularly a device including bipolar transistors, because they are fewer in number than the processing steps required to provide some other known forms of bipolar transistor, each bipolar transistor occupies a smaller part of the contact-bearing surface of the semiconductor body than some other known forms of bipolar transistor, and hence the manufacturing yields are higher.

Such a device may comprise only the plurality of substantially identical resistors of a network according to the present invention.

Whether such a device only comprises the plurality of substantially identical resistors, or not, within the device each constituent component of the device is spaced from each other, and each is substantially electrically isolated from the other constituent components of the device, by an isolation barrier for the component extending through the thin layer to contact the buried layer of the opposite conductivity type, and by regions of the semiconductor body of said one conductivity type.

The bipolar transistors referred to above may comprise the so-called collector-diffusion-isolation transistors, each having an isolation barrier comprising a region of the semiconductor body of the opposite conductivity type.

It is inherently difficult to obtain a network of different weighted CDI-type resistors with highly matched operating characteristics. However, with a network of identical CDI-type resistors of a device according to the present invention it is possible to obtain the required, sufficiently accurate, different weighted resistances suitable for many applications.

Alternatively, the device may have each provided isolation barrier for constituent components comprising electrically insulating material, the device possibly having bipolar transistors with the so-called Isoplanar, or VIP, or V-ATE construction.

The present invention will now be described by way of example with reference to the accompanying drawings, in which.

Figure 1:
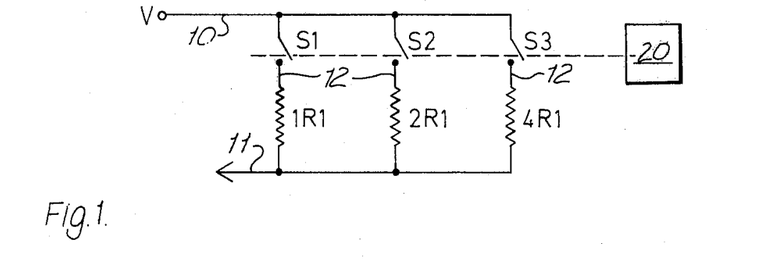
FIG. 1 is a simplified circuit diagram of a known form of a network of binary weighted resistances coupled in parallel with each other, and of an analogue-to-digital (A/D) converter.

A network of binary weighted resistances coupled in parallel with each other is shown in FIG. 1, and is part of an analogue-to-digital (A/D) converter of a known form (not otherwise shown), and to convert an analogue D.C., voltage to a three-bit binary signal. The network resistances are indicated at 1R1, 2R1 and 4R1 i.e., the second resistance has twice the ohmic value of the first resistance, and the third resistance has four times the ohmic value of the first resistance. One end of each of the resistances is connected to a rail 10. Within the network the resistances are arranged to be connected selectively in parallel with one another, and to a source (not shown) of reference voltage V via a rail 11, and via switches S1, S2 and S3. The switches S1, S2 and S3 are connected, respectively, to the resistances 1R1, 2R1 and 4R1 via connections 12. To effect a conversion of the analogue signal to a digital signal, initially switch S1 is closed, the resistance network thereby supplying a reference voltage of most significance. If the reference voltage is greater than the analogue voltage switch S1 is reopened to eliminate that reference voltage; if it is less, switch S1 is kept closed to retain that reference voltage. Switch S2 is then closed, and re-opened or retained closed depending upon whether or not the analogue voltage has been exceeded. And so on. Thus, there is the possibility of reference voltages being summed within the network. When only switch S3 is closed, the reference voltage supplied by the network is of least significance. As a result of these switching operations the digital value of the analogue signal is represented by the pattern of open and closed switches S1, S2 and S3, indicating the digits 0 and 1, respectively, at the digit positions represented by the ohmic values 1R1, 2R1 and 4R1 of the associated resistances. The opening and closing of the switches S1, S2 and S3 is in response to signals from control means, indicated generally at 20, the control means 20 operating in the appropriate manner, at least partially in response to each comparison of the analogue voltage with the different reference voltages supplied by the resistance network.

The present invention is concerned, for example, with the network described above, having the binary weighted resistances 1R1, 2R1 and 4R1 coupled in parallel with each other. The network is to comprise at least part of a semiconductor device in a monolithic semiconductor body.

Desirably, the different weighted resistances of the network are required to be provided as accurately as possible, especially if the network is to be included in a device such as an A/D converter. For a network provided within a semiconductor device inherently there are inadvertent and unmeasurable variations or parameters and operating conditions throughout the semiconductor body, and there has been inadequate control in the processing steps employed in fabricating such a device, causing inadvertent and unpredictable inaccuracies in the resistances of the network under normally encountered operating conditions for the device. The inadvertent and unpredictable variations of the resistances at least partially are caused by inadvertent and unpredictable variations of the voltage-resistance operating characteristic, and other operating characteristics, of the network resistors.

Figure 2:
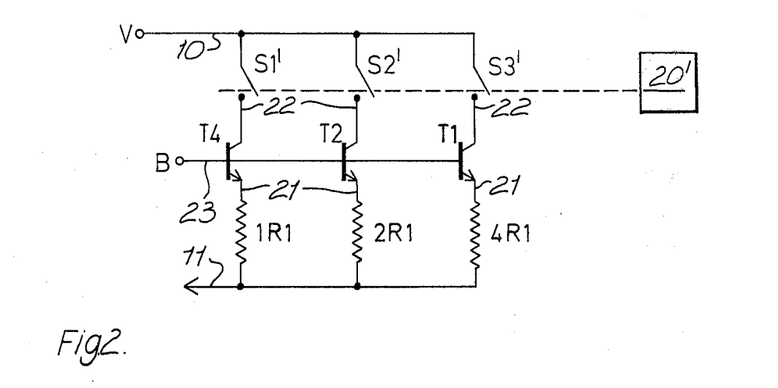
FIG. 2 is a circuit diagram of another network including binary weighted resistances, the network being of a known form, and comprising a modification of the network of FIG. 1, but each constituent network resistance being connected individually to, and in series with, a bipolar transistor, and comprises part of a current source.

FIG. 2 comprises a circuit diagram of a known modification of the network of FIG. 1, and parts of the network of FIG. 2 identical with, or closely resembling, parts of the network of FIG. 1 are identified by the same reference numerals in FIG. 2 as in FIG. 1.

In the operation of the known network of binary weighted resistances coupled in parallel with each other, and of FIG. 2, substantially the same potential difference is applied across each constituent resistance 1R1, 2R1 and 4R1 of the network, to reduce the effect of inadvertent and unpredictable variations of the voltage-resistance operating characteristic of the network resistors to less than would otherwise be the case. Thus, each constituent resistor 1R1, 2R1 and 4R1 of the network is connected individually to, and in series with, an NPN bipolar transistor via connections 21 to the emitters of the transistors, and is part of a current source. The transistors T4, T2 and T1, have binary weighted total emitter areas at the contact bearing surface of the semiconductor body in which the transistor is formed, and, respectively, these emitter areas being such that each product of a total emitter area and associated resistance is a constant. The transistors T4, T2 and T1 produce binary weighted currents through the resistors 1R1, 2R1 and 4R1, respectively, of 4 units, 2 units and 1 unit. Current switches are indicated at S1', S2' and S3' in FIG. 2, and their operation is controlled by control means 20', in similar manner to the switches S1, S2 and S3, and control means 20 of FIG. 1. The collectors of the transistors are connected to the rail 10 via connections 22 and the current switches. A reference potential B is applied to the transistor bases via a common connection 23.

Thus, there is the possibility of the binary weighted currents being summed within the network.

It is also advantageous for a network to provide, in operation, different weighted currents, because generally current switches have a better performance than voltage switches.

Figure 3:
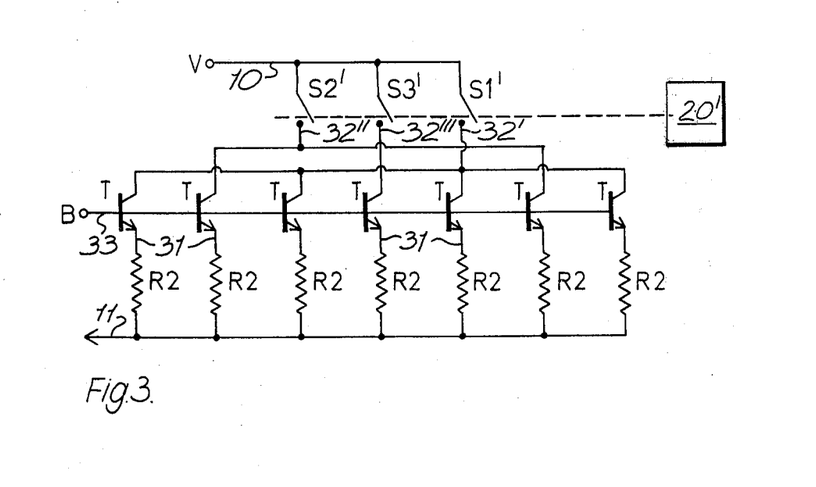
FIG. 3 is a circuit diagram of part of one embodiment of a semiconductor device in accordance with the present invention, the device including a network of resistances coupled in parallel with each other, and corresponding to, but comprising a modification of, the network shown in FIG. 2.

The circuit diagram of FIG. 3 is of a modification of the network of FIG. 2, but when embodied in a semiconductor device, comprises an embodiment according to the present invention. Parts of the network of FIG. 3 identical with, or closely resembling, parts of the network of FIG. 2 are identified by the same reference numerals in FIG. 3 as in FIG. 2.

The resistances and transistors of FIG. 2 are replaced by seven identical series combinations of resistors R2 and bipolar transistors T.

The most significant resistor-transistor series combination 1R1–T4 of FIG. 2 corresponds to four of the seven identical series combinations R2-T coupled in parallel, the series combination 2R1-T2 corresponds to two of the series combinations R2-T coupled in parallel, and the least significant series combination 4R1-T1 corresponds to one of the series combinations R2-T. Hence, binary weighted currents for the network are obtained, although the current and the potential difference associated with each identical R2-T series combination are the same.

The seven, identical series combinations R2-T are shown interdigitated with each other, being uniformly distributed amongst each other.

A connection 31 is shown between each resistor R2 and the emitter of the associated transistor T.

Only the three current switches S1', S2' and S3' are provided, and the connections between the switch S1' and the collectors of the four identical series combinations of the resistor R2 and the transistor T are indicated at 32', between the switch S2' and the two identical series combinations R2-T at 32'', and between the switch S3' and the series combination R2-T at 32'''. The reference potential B is applied to the transistor bases via a common connection 33.

Figure 4:
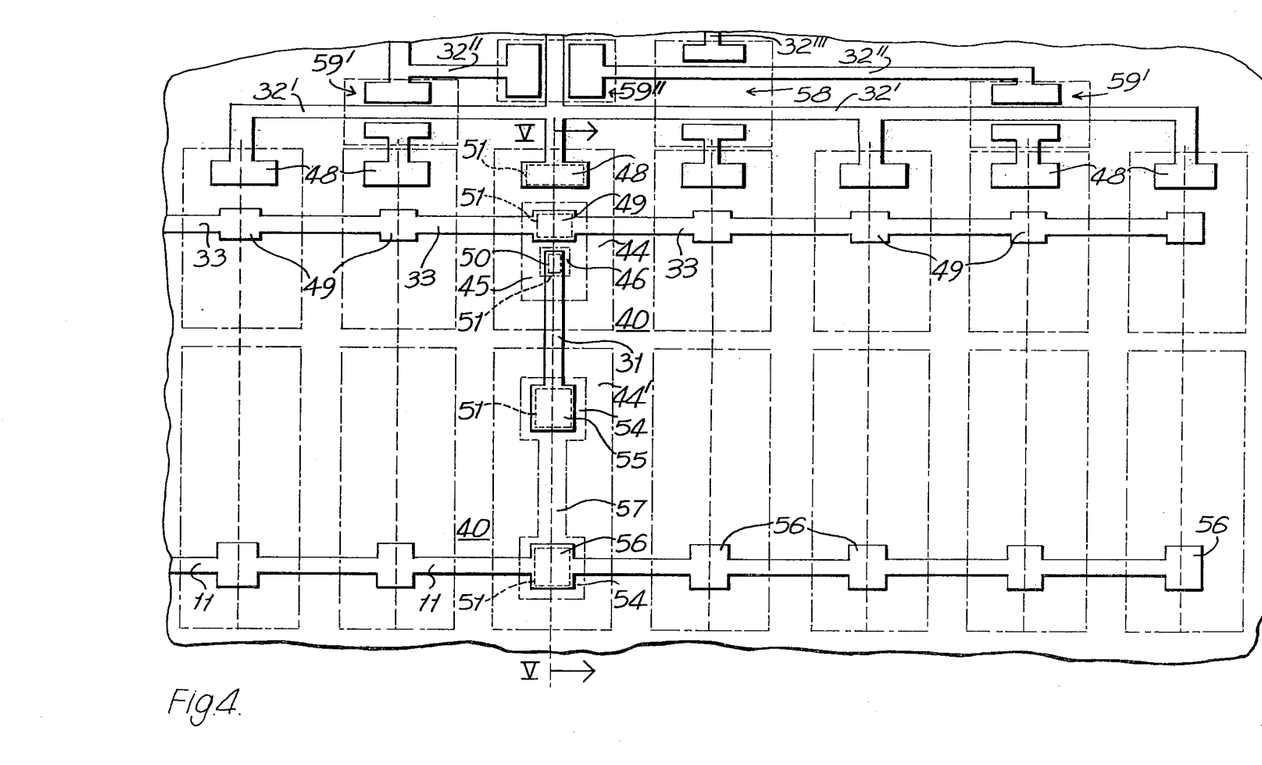
FIG. 4 is a plan view of a portion of the semiconductor device embodying part of the circuit arrangement of FIG. 3.
Figure 5:
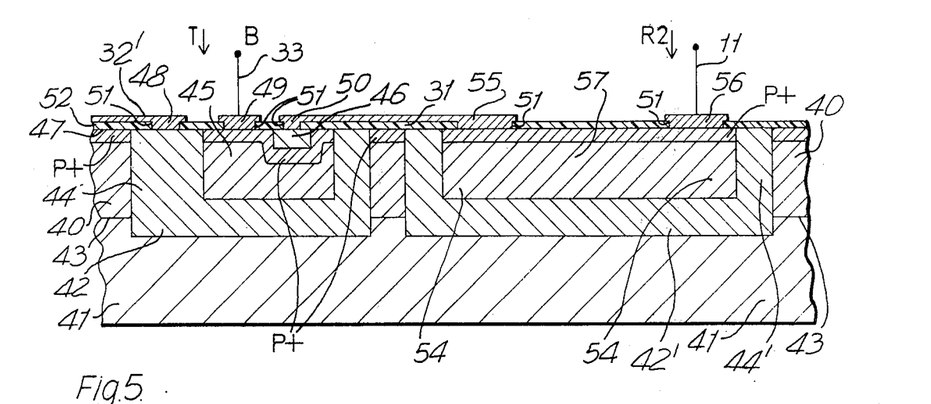
FIG. 5 is a section of the semiconductor device portion of FIG. 4, and on the line V—V of FIG. 4.

A plan view of a part of a semiconductor device, comprising one embodiment according to the present invention, and embodying the circuit arrangement of FIG. 3, is shown in FIG. 4, the illustrated device part including the identical series combinations of bipolar transistors T and resistors R2 of FIG. 3. FIG. 5 is a section on the line V—V of FIG. 4.

Further, FIG. 3 represents schematically the plan of the semiconductor device. As shown, the identical series resistor-transistor combinations R2-T extend linearly, and the series combinations extend parallel to each other, and are interdigitated with each other, within the semiconductor body.

In the illustrated device each bipolar transistor has the so-called collector-diffusion-isolation (CDI) construction, and each resistor R2 has a construction closely resembling that of the CDI bipolar transistor T.

For convenience, only one series combination of a resistor R2 and a transistor T, of the seven identical such series combinations, is shown in detail. In FIG. 4 the other series combinations are indicated generally by a dotted line extending axially along the position of the series combination.

As is more clearly shown in FIG. 5, the NPN CDI transistor T is formed, by known processing steps, in a semiconductor body comprising a thin P-type epitaxial layer 40 on a P-type substrate 41. The collector of the transistor T comprises the combination of an N+ type buried layer 42 at a portion of the interface 43 between the epitaxial layer 40 and the substrate 41, and an N+ type isolation barrier 44 for the transistor, which isolation barrier 44 extends through the epitaxial layer 40 to the buried layer 42. The base 45 of the transistor T comprises an unmodified region of the P-type epitaxial layer defined by the collector 42, 44, and the emitter 46 comprises an N+ type region formed in the base 45 and adjacent to the surface 47 of the epitaxial layer remote from the substrate 40. Contacts 48, 49 and 50 are provided on the surface 47, respectively, to the collector 42, 44, the base 45, and the emitter 46. The contacts 48, 49 and 50 extend through apertures 51 in a layer of passivating material 52 on the surface 47.

For the sake of clarity, in the plan view of FIG. 4 the passivating layer 52 is omitted, although the apertures 51 in the passivating layer are indicated by dotted lines.

The buried layer 42 is also omitted, but portions of the P-N junctions of the transistor adjacent to the surface 47 are shown in chaindotted line form. The contacts 48, 49 and 50 are shown in continuous line form.

As is more clearly shown in FIG. 4 the identical resistor R2 extends linearly within the epitaxial layer 40 of the semiconductor body, with enlarged portions 54 bearing contacts 55 and 56 at either end of an elongated intermediate portion 57. The contacts 55 and 56 extend through apertures 51 in the passivating layer 52. In FIG. 4 the resistor R2 is represented in a similar manner as the transistor T. As is more clearly shown in FIG. 5, the resistor R2 has a construction closely resembling the construction of the CDI transistor T. Thus, the portions 54 and 57 of the resistor R2 comprise an unmodified region of the P-type epitaxial layer defined by a combination of an N+ type buried layer 42' at a portion of the interface 43 between the epitaxial layer 40 and the substrate 41 and an N+ type isolation barrier 44' for the resistor, which isolation barrier 44' extends through the epitaxial layer to the buried layer 42'. Consequently, the resistor R2 is a CDI-type component of the device.

As is more clearly shown in FIG. 4, the illustrated portion of the semiconductor device is completed by electrical connections provided on the passivating layer 52 and extending from the contacts of the transistor T and the resistor R2. The electrical connections are shown in continuous line form. Thus, an electrical connection 11 is provided between each resistor contact 56, all seven contacts 56 being shown for this purpose, and the connection 11 extends beyond the network. An electrical connection 31 extends between each other resistor contact 55 and the emitter contact 50 of the associated transistor. For the interdigitated series combinations of resistors R2 and transistors T, an electrical connection 32' connects together the collectors of the four series combinations to be connected to the current switch S1' (not shown in FIGS. 4 or 5); an electrical connection 32'' connects together the collectors of the two series combinations to be connected to the switch S2' (not shown), three cross-unders 59' and 59'' each of a conventional form, being provided so that the electrical connection 32'' can cross the electrical connection 32'; and an electrical connection 32''' connects the collector of one of the series combinations to the switch 53' (not shown), a cross-under 58 being provided so that the electrical connection 32''' can cross the electrical connections 32' and 32''. For this purpose all seven collector contacts 48 are shown. An electrical connection 33 is provided between each base contact 49, all seven base contacts being shown for this purpose, and the connection 33 extends beyond the network.

It is conventional, but not essential, to provide in a semiconductor device having CDI-type components P+ type portions (FIG. 5), adjacent to the surface 47 of the semiconductor body, and within all the unmodified P-type regions of the epitaxial layer 40. The P+ type surface portions are provided in a nonselective diffusion process step before the provision of the emitter 46 and surround the emitter 46 within the semiconductor body. Such heavily doped surface portions are advantageous because, inter alia, they are not likely to change inadvertently their conductivity type, and they increase the gain-bandwidth product of the transistors.

The arrangement of the device according to the present invention is required to be such that, for any resistor construction, the desired different weighted resistances of the network are obtained more accurately, under normally-encountered operating conditions for the device, than for a network of different weighted resistors. This criterion is obtainable because the constituent identical resistors of the network have more highly matched operating characteristics, and/or because the effects of inadvertent and unpredictable variations in the operating characteristics of the constituent resistors of the network are reduced, and/or because inadvertent and unpredictable variations in the operating conditions to which the constituent resistors of the network are subjected are reduced. This is, in general, because the illustrated network of a plurality of identical resistors is provided.

Further, because identical resistors and bipolar transistors are provided in the network of FIG. 3, the constituent resistors R2 and transistors T have more highly matched operating characteristics, for example, in relation to the emitter-base operating potential differences of the transistors, and/or the effect of inadvertent and unpredictable variations of these operating characteristics are reduced, because the identical resistors and transistors are subjected to more uniform operating conditions, than otherwise would be the case.

It is advantageous if the identical series resistor-transistor combinations R2-T are as close to each other as possible within the semiconductor body.

A particular advantage of the arrangements of FIGS. 3, 4 and 5 is that the voltage resistance coefficient of the 4 and 5 is that the resistance-temperature coefficient of the that the effects of these coefficients tend to cancel each other.

The effect of inadvertent and unpredictable variations of the operating characteristics of the constituent identical resistors of such a network is reduced by the operating conditions, such as the currents and applied potential differences, to which the identical resistors are subjected, being more uniform in relation to each of the identical resistors, compared with if different weighted resistors for the network had been provided.

In addition, by providing a plurality of substantially identical resistors, with any construction, for the network, it is possible to ensure that the constituent resistors have more highly matched operating characteristics than if different weighted resistors of the same construction had been provided in the semiconductor body.

Because of any one of the constructional features of the network of FIGS. 4 and 5, referred to above, the effect of inadequately controlled processing steps in fabricating the semiconductor device, and/or of variations of relevant parameters and/or operating conditions within the semiconductor body, are reduced, to obtain highly matched operating characteristics for the identical resistors, by reducing inadvertent and unpredictable variations of such operating characteristics. Satisfactory interdigitation of different weighted resistors of a network, in order to obtain highly matched operating characteristics for the resistors, is difficult.

Even if the constituent identical resistors of the network have highly matched operating characteristics, there may be inadvertent and predictable variations of the relevant operating conditions, such as temperature gradients within the body, which are capable of causing inadvertent and unpredictable variations in the different weighted resistances of the network. However, with any one of the construction features for a network of identical resistors of FIGS. 4 and 5, and described above, the effects of such inadvertent and unpredictable operating conditions are less than otherwise would be the case.

The arrangement of FIG. 3 superficially is disadvantageous to be embodied in a monolithic semiconductor device, because the total resistance value of the network is greater than, for example, if a corresponding 2R-R ladder network had been employed; and because of the greater number of constituent resistors than, for example, if a corresponding network inherently occupying a greater area of the contact-bearing surface of the semiconductor body, reducing manufacturing yields. However, the arrangement of FIG. 3, unexpectedly is advantageous for a binary weighted resistance network to be embodied in a monolithic semiconductor device, because of the accuracy with which the binary weighted resistances may be provided for the normally-encountered operating conditions of the device.

Because the plurality of identical network resistors R2 of a device according to the present invention are to be connected in series with bipolar transistors T, the resistor construction employed, advantageously, closely resembles the bipolar transistor construction employed within the device. For this reason it may be desirable to use within the network a resistor construction in relation to which it is inherently difficult to obtain a network of different weighted resistors with highly matched operating characteristics, for example, the network resistors comprising CDI-type components, having a construction closely resembling the construction of CDI bipolar transistors.

Figures 6, 7:
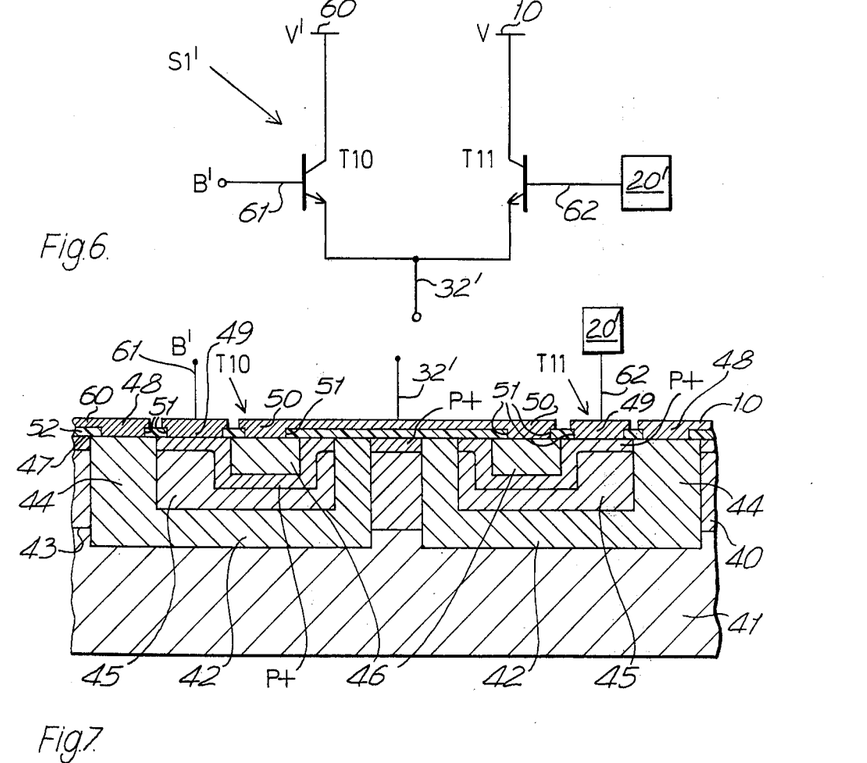
FIG. 6 shows a long-tailed pair of transistors suitable to provide a current switch of the circuit arrangement of FIG. 3.
FIG. 7 is a section of part of a semiconductor device in which is embodied the long-tailed pair of transistors of FIG. 6.

The current switches S1', S2' and S3' each conveniently comprise a long-tailed pair of transistors. Such a circuit arrangement for the swithc S1' is shown in FIG. 6, the NPN transistors being indicated at T10 and T11, The transistor emitters are connected together by the electrical connection 32', also connecting together the switch S1' and the collectors of the identical series combinations R2-T to be connected to the switch. The collector of the transistor T10 is connected to a rail 60 to be maintained at a reference potential V' by a source (not shown). The base of the transistor T10 is connected, via an electrical connection 61 to a source (not shown) providing an output potential B'. The collector of the transistor T11 is connected to the rail 10, and the base of the transistor T11 is connected, via a electrical connection 62, to the control means 20'.

Each current switch is to be embodied in the device shown partially in FIGS. 4 and 5, and the portion of the device embodying the current switch S1' is shown in FIG. 7. Parts of the device portion of FIG. 7 identical to, or closely resembling, parts of the device portion of FIGS. 4 and 5, are identified by the same reference numerals in FIG. 7 as in FIGS. 4 and 5.

Various modifications to the illustrated device, and in accordance with the present invention, are possible.

The thin layer of the semiconductor body of a CDI-type device may not be of epitaxial material. The regions of the thin layer defined by a combination of a buried layer and an isolation barrier may not comprise unmodified regions of the thin layer, whilst remaining of the same conductivity type as the thin layer.

Other CDI-type resistor constructions are known, for example, the CDI-type resistor construction employed can be as described and claimed in either of my copending U.S. patent applications Ser. Nos. 710,746 and 784,464, each such resistor being advantageous, having a substantially linear resistance-voltage characteristic.

Advantageously, the bipolar transistor has any epitaxial base construction, instead of the collector-diffusion-isolation epitaxial base construction, each such transistor construction capable of being formed in a semiconductor body initially comprising a shallow epitaxial layer of one conductivity type on a substrate of the same conductivity type, having a collector including a buried layer of the opposite conductivity type at the interface between the epitaxial layer and the substrate, the base and the emitter being provided within the epitaxial layer, and, when the transistor is considered in plan, the whole of the emitter being directly opposite to the buried layer, the base at least including an unmodified portion of the epitaxial layer, and being contiguous with the buried layer of the collector. Thus, the bipolar transistor may have the so-called Isoplanar, or VIP, or V-ATE construction.

Each such transistor construction closely resembles that of a collector-diffusion-isolation transistor described above except that the isolation barrier does not comprise part of the collector. Instead the collector, in addition to including the buried layer, includes a region of the epitaxial layer modified by inclusion of an impurity characteristic of the opposite conductivity type, and extending to the surface of the epitaxial layer remote from the substrate. An isolation barrier is substantially the same shape as that of a collector-diffusion-isolation transistor, but the isolation barrier is wholly of silicon oxide; in a V-ATE transistor the isolation barrier is a 'V'-section groove etched through the epitaxial layer and coated with silicon oxide; and in a VIP transistor the isolation barrier is a 'V'-section groove etched through the epitaxial layer, coated with silicon oxide, and filled with polycrystalline silicon material.

Any such epitaxial base construction for a bipolar transistor is advantageous because it may occupy a smaller part of the contact bearing surface of the epitaxial layer than some other bipolar transistor constructions. In addition, each may require fewer processing steps in its fabrication than most other known forms of bipolar transistor, and hence manufacturing yields are higher.

Figure 8:
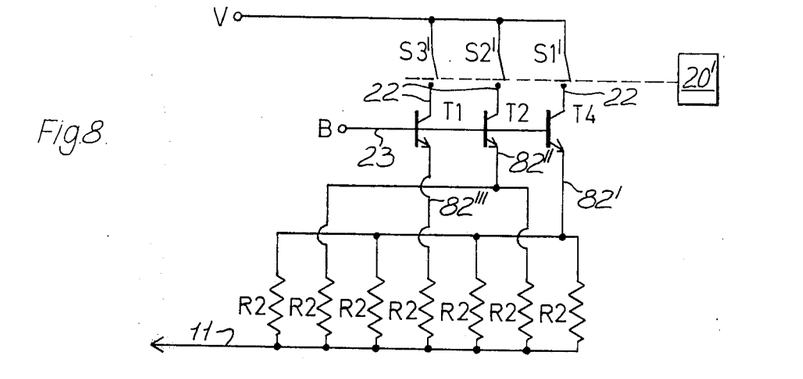
FIG. 8 is a circuit diagram of a modification of the network of FIG. 3, and comprising another embodiment according to the present invention when embodied in a semiconductor device.

A modification of the circuit arrangement of FIG. 3 is shown in FIG. 8, the circuit arrangement of FIG. 8 comprising one embodiment according to the present invention when embodied in a semiconductor device. Parts of the circuit arrangement of FIG. 8 identical with, or closely resembling parts of the circuit arrangement of FIG. 3, are identified by the same reference numerals in FIG. 8 as in FIG. 3.

In the circuit arrangement of FIG. 8, only three bipolar transistors are provided for the required current sources. Thus, the circuit arrangement is less advantageous than the circuit arrangement of FIG. 3. The three provided bipolar transistors comprise the transistors T1, T2 and T4, as shown for the known circuit arrangement of FIG. 2, and having binary weighted total emitter areas at the contact bearing surface of the semiconductor body of the device. The transistors produce binary weighted currents, respectively of 4 units, 2 units, and 1 unit. An electrical connection 82' is provided between the emitter of the transistor T4 and the four identical resistors R2 to be connected thereto; an electrical connection 82'' is provided between the emitter of the transistor T2 and the two identical resistors R2 to be connected thereto; and an electrical connection 82''' is provided between the emitter of the transistor T1 and the resistor R2 to be connected thereto. Electrical connections 22 are provided between the transistors T4, T2 and T1 and, respectively, the current switches S1', S2' and S3'. Otherwise the circuit arrangement of FIG. 8 is identical with that of FIG. 3, and may be embodied in a semiconductor device including the illustrated portions of FIGS. 4, 5 and 7.

Figure 9:
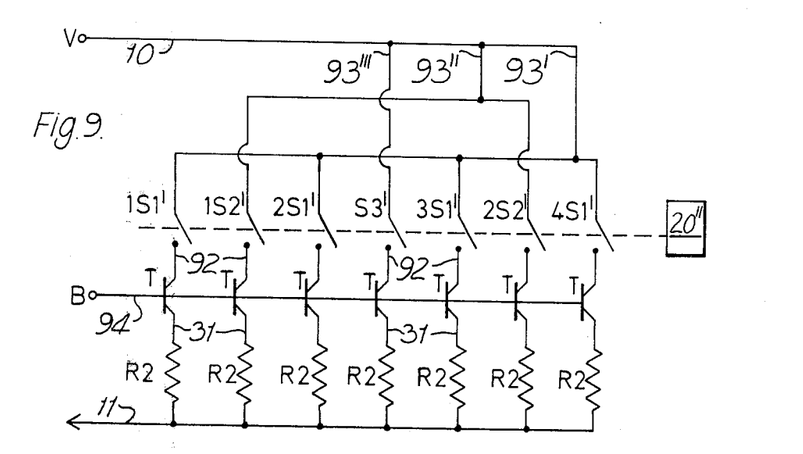
FIG. 9 is a circuit diagram of a further modification of the network of FIG. 3, and corresponding to part of a device according to the present invention.

Another modification of the circuit arrangement of FIG. 3 is shown in FIG. 9, the circuit arrangement of FIG. 9 comprising another embodiment according to the present invention when embodied in a semiconductor device. Parts of the circuit arrangement of FIG. 9 identical with, or closely resembling parts of the circuit arrangement of FIG. 3, are identified by the same reference numerals in FIG. 9 as in FIG. 3.

In the circuit arrangement of FIG. 9 identical current switches are provided individually in series with each identical series combination of a resistor R2 and transistor T. Thus, between the rail 10 and the four identical series combinations to be connected together are provided four identical current switches 1S1', 2S1', 3S1' and 4S1'; between the rail 10 and the two identical series combinations to be connected together are provided two identical current switches 1S2' and 2S2'; and between the rail 10 and the remaining series combination is provided a switch S3'. Electrical connections 92 are provided between each transistor T and the associated current switch. An electrical connection 93' is provided between the switches 1S1', 2S1', 3S1' and 4S1', and the rail 10; an electrical connection 93'' is provided between the switches 1S2' and 2S2', and the rail 10; and an electrical connection 92''' is provided between the switch S3' and the rail 10. A common connection 94 connects the transistor bases to the source of reference potential B. Otherwise the circuit arrangement of FIG. 9 is identical with that of FIG. 3, and may be embodied in a semiconductor device including the illustrated portions of FIGS. 4, 5 and 7. Thus, the current switches have highly matched operating characteristics, and the circuit arrangement of FIG. 9 is more advantageous than that of FIG. 3.

The current switches S1', S2' and S3' may have any convenient form, for example, each not comprising a long-tailed pair of bipolar transistors.

Conveniently the current switches are included as part of the control means controlling the opening and closing of the switches.

An identical bipolar transistor may not be provided in series with each identical resistor, although each identical resistor is part of a current source.

Figure 10:
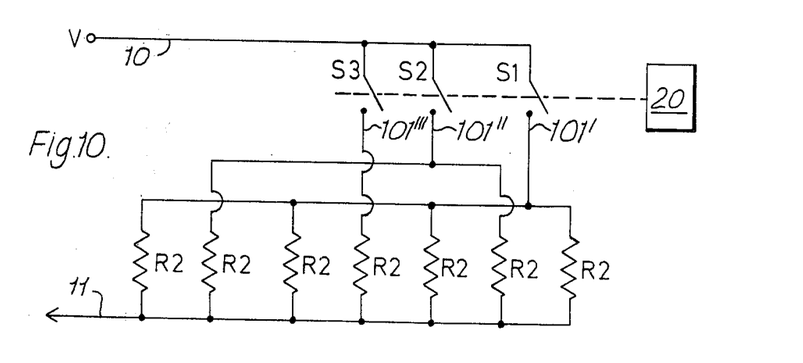
FIG. 10 is a circuit diagram of a modification of the network of FIG. 1, the modification when embodied in a semiconductor device comprising another embodiment according to the present invention.

In the circuit arrangement of FIG. 10 the identical resistors R2 coupled in parallel between the rails 10 and 11 are not part of current sources, and so the circuit arrangement is a modification of that of FIG. 1 although it includes the resistor network of FIG. 3. Parts of the circuit arrangement of FIG. 10 identical with, or closely resembling, those of FIG. 1 are identified by the same reference numerals in FIG. 10 as in FIG. 1. An electrical connection 101' is provided between the four identical resistors R2 to be connected together, and the switch S1; an electrical connection 101'' is provided between the two identical resistors R2 to be connected together, and the switch S2; and an electrical connection 101''' is provided between the remaining resistor R2 and the switch S1. The circuit arrangement of FIG. 10 comprises yet a further embodiment according to the present invention when embodied in a semiconductor device, the resistor network of the device possibly comprising a modification of the resistor network illustrated in FIGS. 4 and 5. The switches S1, S2 and S3 may have any convenient form when embodied in the device. The circuit arrangement of FIG. 10 is less advantageous than the circuit arrangement of FIG. 3, in the same manner as the circuit arrangement of FIG. 1 is less advantageous than the circuit arrangement of FIG. 2, as referred to above.

The identical resistors of the network may not extend linearly within the semiconductor body, and/or they may not have the same orientation in relation to each other, and/or they may not be interdigitated in the manner described above. However, usually they will be provided as close to each other as possible within the semiconductor body.

Any type of resistor construction, and bipolar transistor construction, may be employed, and it is not essential that the resistor construction should closely resemble the construction of bipolar transistors also provided within the device.

The conductivity types of all the constituent regions of the semiconductor device may be reversed.

The desired different weighted resistances of the network may be weighted in relation to each other in accordance with any predetermined radix.

The device including such a network may be other than an A/D converter, for example, switches may not be provided in the network.

The different weighted resistances of the network, and/or the constituent identical resistors, coupled in parallel with each other, may be connected, either directly, or indirectly, in parallel.

A network of different weighted resistances with constituent identical resistors coupled in parallel, and in accordance with the present invention, may be part of a larger network of different weighted resistances, the other resistances of the larger network not being provided by identical resistors coupled in parallel.

What I claim is:

1. A semiconductor device in a monolithic semiconductor body comprising
    (a) a plurality of weighted resistors of differing resistances;
    (b) each of said plurality of resistors comprising a selected number of substantially identical resistor portions coupled in parallel to each other, the number of identical resistor portions being selected to provide the required differing resistances of its weighted resistor;
    (c) said substantially identical resistor portions of each of said resistors of said plurality being spaced from each other by identical resistor portions of other resistors of said plurality in an interdigitated fashion, and being substantially uniformly distributed throughout said plurality of resistors; and each of said substantially identical resistor portions of said plurality of resistors extending linearly within said semiconductor body in a parallel relation with each other, and being electrically isolated within said semiconductor body from each other.

2. A semiconductor device as claimed in claim 1 wherein said semiconductor body comprises:
    (a) a substrate made of a material of a first conductivity type:
    (b) A first layer initially made wholly of a material of the first conductivity type and disposed on said substrate to form an interface therebetween;
    (c) each of said substantially indentical resistor portions comprising a first region within said first layer made of a resistive material and spaced from each of said other of said plurality of identical resistor portions;
    (d) each of said first regions being isolated from the rest of said semiconductor body by a second buried layer of a material of the second conductivity type and buried at said interface, and of a second region disposed as an isolation barrier about said first region and extending through said first layer.

3. A semiconductor device as claimed in claim 2, wherein said first layer comprises a first surface abutting said substrate and a second surface and there is further included a bipolar transistor comprising:
    (a) a collector comprised of a first layer made of a material of the second conductivity type and buried at a portion of said interface;
    (b) a base comprising a third region of said first layer and made of a material of the first conductivity type; and
    (c) an emitter comprised of a fourth region made of a material of the second conductivity type and disposed within said third region adjacent to said second surface of said first layer; said bipolar transistor being spaced from said resistances and being substantially isolated therefrom by a third buried layer and a fifth region extending through said first layer.

4. A semiconductor device as claimed in claim 2 in which each provided isolation barrier comprises a second region of a material of the second conductivity type.

5. A semiconductor device as claimed in claim 2 in which the first layer comprises an epitaxial layer.

6. A semiconductor device as claimed in claim 3 in which said fifth region is of a material of said second conductivity type.

7. A semiconductor device as claimed in claim 3 in which said first layer comprises an epitaxial layer.

8. A semiconductor device in a monolithic semiconductor body comprising:
    (a) a plurality of weighted resistors of differing resistances;
    (b) each of said plurality of resistors comprising a selected number of substantially identical resistor portions coupled in parallel to each other, the number of identical resistor portions being selected to provide the required differing resistance of its weighted resistor;
    (c) said substantially identical resistor portions of each of said resistors of said plurality being spaced from each other by identical resistor portions of other resistors of said plurality in an interdigitated fashion, and being substantially uniformly distributed throughout said plurality of resistors and each of said substantially identical resistor portions of said plurality of resistors extending linearly within said semiconductor body in a parallel relation with each other; and being electrically isolated within said semiconductor body from each other; and
    (d) a plurality of bipolar transistors;
    (e) each resistor of said plurality being coupled in series of the emitter of its one of said plurality of bipolar transistors;
    (f) each of said plurality of bipolar transistors including an emitter having a different weighted area, the product of the emitter area and resistance of each resistor being substantially constant for each of said coupled bipolar transistors and resistors.

9. A semiconductor device as claimed in claim 8 in which each coupled resistor and bipolar transistor comprises a current source, each of said current sources is connected respectively in series with a current switch.

10. A semiconductor device as claimed in claim 8 in which each coupled resistor and bipolar transistor, comprises a current source, each of said current sources is connected in series with a current switch, different current switches being connected to a different one of said coupled resistors and bipolar transistors, and each of the plurality of identical current switches comprises a long-tailed pair of bipolar transistors.

11. A semiconductor device as claimed in claim 8 in which a plurality of identical bipolar transistors are connected individually to, and in series with, the plurality of identical resistor portions, different identical bipolar transistors being connected to different identical resistor portions, and each resistor portion is connected to a bipolar transistor.

12. A semiconductor device as claimed in claim 11 in which each coupled resistor portion and bipolar transistor comprises a current source and is connected in series with a current switch, different current switches being connected to different resistor portions and bipolar transistors, each coupled resistor portion and bipolar transistor being connected to a current switch.

13. A semiconductor device as claimed in claim 8 in which each resistor portion is coupled in series with only one current switch, different current switches being coupled to different resistor portions, each resistor portion being coupled to a current switch.

14. A semiconductor device as claimed in claim 12 in which each of said current switches comprises a long-tailed pair of bipolar transistors.

\* \* \* \* \*

UNITED STATES PATENT AND TRADEMARK OFFICE
CERTIFICATE OF CORRECTION

PATENT NO. : 4,336,528
DATED : June 22, 1982
INVENTOR(S) : Jeffrey Kane

It is certified that error appears in the above-identified patent and that said Letters Patent are hereby corrected as shown below:

<u>In Claim 13</u>

Column 18, line 11, delete "portion";

Line 13, delete "resistor portions" and substitute therefor -- resistors --;

Line 14, delete "portion".

Signed and Sealed this

*Twelfth* Day of *October 1982*

[SEAL]

Attest:

GERALD J. MOSSINGHOFF

*Attesting Officer*  *Commissioner of Patents and Trademarks*